United States Patent
Li et al.

(10) Patent No.: US 8,051,313 B2
(45) Date of Patent: Nov. 1, 2011

(54) APPARATUS, SYSTEM AND METHOD OF POWER STATE CONTROL

(75) Inventors: Bixia Li, Plano, TX (US); Hugh Mair, Fairview, TX (US); Minh Chau, Carrollton, TX (US); Alice Wang, Allen, TX (US); Uming Ko, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 688 days.

(21) Appl. No.: 12/110,589

(22) Filed: Apr. 28, 2008

(65) Prior Publication Data

US 2009/0267638 A1    Oct. 29, 2009

(51) Int. Cl.
  *G06F 1/00* (2006.01)
  *G05F 1/10* (2006.01)
  *H03K 3/02* (2006.01)
  *H03K 17/16* (2006.01)
(52) U.S. Cl. .......... 713/323; 327/198; 327/546; 326/21
(58) Field of Classification Search .................. 713/323; 327/546, 198; 326/21
  See application file for complete search history.

(56) References Cited

U.S. PATENT DOCUMENTS

| | | | |
|---|---|---|---|
| 6,883,152 B2* | 4/2005 | Bednar et al. ................ | 716/113 |
| 7,039,818 B2 | 5/2006 | Deng et al. | |
| 7,167,017 B2 | 1/2007 | Arora et al. | |
| 7,216,272 B2 | 5/2007 | Loh | |
| 7,863,971 B1* | 1/2011 | Nayak et al. .................. | 327/546 |
| 2003/0122429 A1* | 7/2003 | Zhang et al. .................... | 307/43 |
| 2006/0184808 A1* | 8/2006 | Chua-Eoan et al. .......... | 713/300 |
| 2006/0288246 A1* | 12/2006 | Huynh .......................... | 713/320 |
| 2007/0245278 A1* | 10/2007 | Chen ................................ | 716/5 |
| 2008/0162957 A1* | 7/2008 | Lassa et al. ................... | 713/310 |
| 2008/0276110 A1* | 11/2008 | Indiani et al. ................. | 713/330 |
| 2009/0119526 A1* | 5/2009 | Liu et al. ....................... | 713/323 |
| 2009/0210836 A1* | 8/2009 | Phan Vogel ...................... | 716/5 |

* cited by examiner

*Primary Examiner* — Mark Rinehart
*Assistant Examiner* — Christopher A Daley
(74) *Attorney, Agent, or Firm* — John R. Pessetto; W. James Brady; Frederick J. Telecky, Jr.

(57) ABSTRACT

An apparatus, system and method for asynchronously reducing power in a power domain. In one embodiment, the method includes: (1) receiving a sleep command for the power domain, (2) receiving, upon receiving the sleep command, an affirmative retention status signal denoting that a retention area in the power domain has stored data, (3) receiving, upon receiving the sleep command, an affirmative isolation status signal that denotes that an isolation of the power domain has occurred and (4) providing a power domain off command to the power domain upon receiving at least the sleep command, the affirmative status retention signal and the affirmative status isolation signal. In another embodiment, multiple enable signals are employed to generate a "glitch-free" control for a power switch.

8 Claims, 12 Drawing Sheets

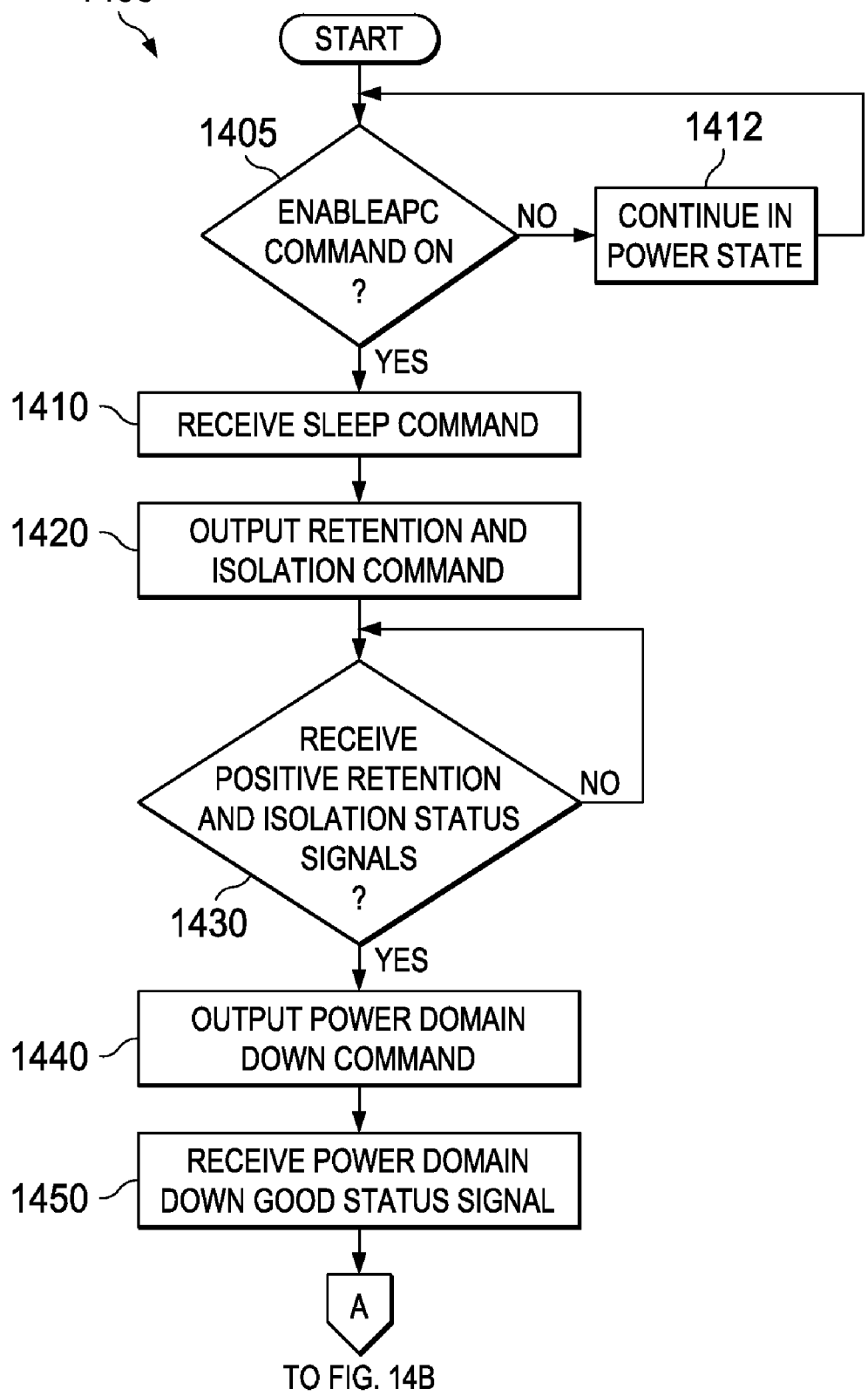

APPARATUS, SYSTEM AND METHOD OF POWER STATE CONTROL

TECHNICAL FIELD OF THE INVENTION

The invention is directed, in general, to a power state controller and, more specifically, to a power state controller that can be used in an integrated circuit (IC) to control power provided to a power domain.

BACKGROUND OF THE INVENTION

Power control in ICs is becoming an increasingly important part of processor hardware design, and ample reasons exist to believe that IC power control will become even more important in the future. However, several serious problems are associated with power control in ICs.

For example, controlling power delivered to different types of memory can be complex. A retention cell, for example, has a dedicated, low-power storage area (called a retention area) for storing information when not in active use and an externally accessible area for storing information when in active use. However, timing transitions between the retention area and the accessible area can be challenging. Aside from memory issues such as this, just applying power to various parts of an IC (called "power domains") can itself be challenging.

What is needed in the art is method and device that is employable with retention cells that addresses at least some of the deficiencies of the prior art.

SUMMARY OF THE INVENTION

To address the above-discussed deficiencies of the prior art, one aspect of the disclosure provides a method of asynchronously reducing power of a power domain. One embodiment of the method includes: (1) receiving a sleep command for the power domain, (2) receiving, upon receiving the sleep command, an affirmative retention status signal denoting that a retention area in the power domain has stored data, (3) receiving, upon receiving the sleep command, an affirmative isolation status signal that denotes that an isolation of the power domain has occurred and (4) providing a power domain off command to the power domain upon receiving at least the sleep command, the affirmative status retention signal and the affirmative status isolation signal.

Another aspect of the invention provides a method of asynchronously increasing power to a power domain. In one embodiment, the method includes: (1) receiving an awaken command for a selected power domain, (2) providing a power domain on signal to the power domain upon receiving the awaken command, (3) determining whether a power domain good status signal has been received, (4) providing a non-retention command and a non-isolation command after receiving the negative power good status signal and (5) receiving, upon receiving the awaken command, an affirmative isolation status signal denoting that an isolation of the power domain has occurred.

Yet another aspect of the invention provides an apparatus for asynchronously selecting a power level in a memory chip area. In one embodiment, the apparatus includes first combinational logic and second combinational logic. The apparatus also includes a sleep command input coupled to the first and second combinational logic, a retention status input and an isolation status input coupled to the first and second combinational logic. The apparatus further includes a power status input denoting whether all power that is applied to the power domain is on. The first combinational logic provides a power domain command to the power domain when combining at least the sleep input, the retention status input and the isolation status input. The second combinational logic provides a retention and isolation command when combining at least the sleep input, the retention status input and the isolation status input.

Still another aspect of the invention provides a system for asynchronously controlling power to be applied to a power domain. One aspect of the system includes: (1) a power switch coupled to at least two different power levels, (2) a retention cell coupled to the power switch, (3) an isolation cell coupled to the retention cell and (4) an asynchronous power controller.

Yet still another aspect of the invention provides an asynchronous power controller. In one embodiment, the controller receives (5) an isolation status signal, received from the isolation cell, that denotes whether an isolation of a power domain has occurred, (6) a retention status signal, received from the retention cell, that denotes whether a retention area in the power domain has stored data and (7) a power status signal that denotes whether all power applied to the domain area is in a same state, (8) wherein the power controller generates a power domain command to the power switch when sequentially combining an isolation status signal, a retention status signal and a power status signal.

Another aspect of the invention provides a method of employing a power converter. In one embodiment, the method includes: (1) receiving a plurality of power domain commands, (2) providing a combined enable command from a combination of the plurality of enable power domain commands, (3) latching the combined enable command on a first edge of a clock signal, (4) providing the combined enable command to at least one power switch on a reference clock status and (5) transitioning the clock cycle to a second edge of the same clock cycle.

BRIEF DESCRIPTION OF THE DRAWINGS

For a more complete understanding of the invention, reference is now made to the following descriptions taken in conjunction with the accompanying drawings, in which:

FIG. 14A illustrates a method of generating a power domain off sequence of the asynchronous power controller of FIG. 1;

DETAILED DESCRIPTION

Figure 1:
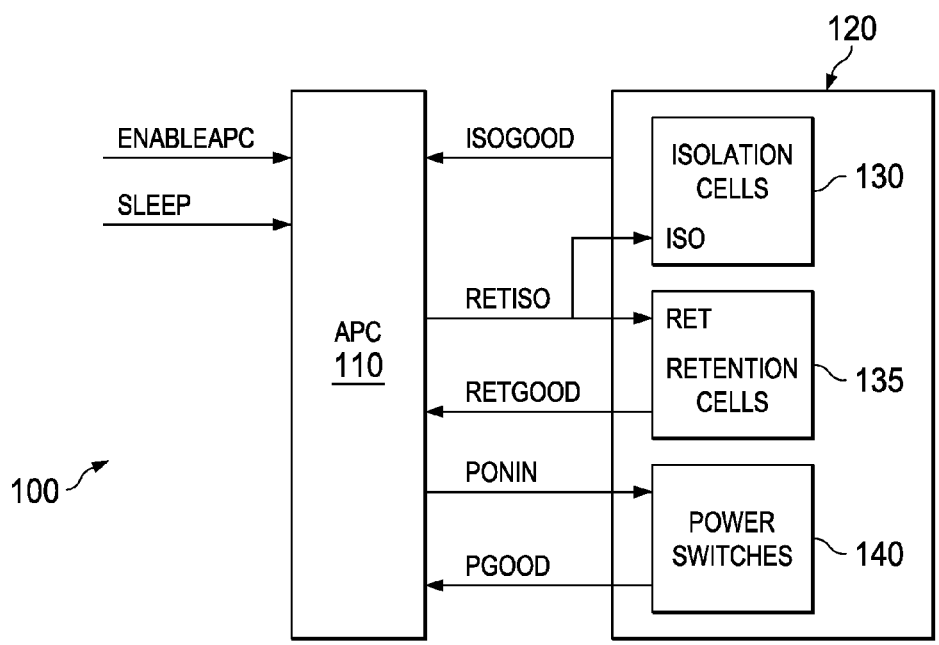
FIG. 1 is an illustration of an embodiment of a system that provides reliable isolation, retention and power control signals to retention cells for asynchronously controlling a power domain of an IC chip.

FIG. 1 illustrates a system 100 for asynchronously controlling a coupled power domain 120 of an IC chip that provides reliable isolation, retention, a power signals to a plurality of retention cells 135. In the disclosure, "reliable" is generally defined as providing no intermediate logic states. This can be accomplished through use of combinatorial sequential logic, as will be described later on in the specification. Asynchronous power control can be generally defined as a power controller ("APC") 110 transitioning between power command states without a use of a received clock signal. Avoiding a reception of a clock signal in the asynchronous power controller 110 can help achieve a fast power-up/power-down independent of clock frequency.

Generally, the system 100 generates and provides power domain off commands and power domain on commands (collectively referred to as "PonIn" signals) derived from, at least in part, a "Sleep" signal, or its alternative state, an "Awake" signal. State transitions (i.e., various outputs of the asynchronous power controller 110) are asserted or de-asserted, as will be described below. Generally, the speed at which the APC 110 can react to changes in the sleep command can depend upon how quickly power switches can react upon receiving a power-on command, how quickly isolation cells 130 can all finish their isolation process and how quickly the retention cells 135 all go to a retention mode upon reception of retention signal. However, advantageously, the APC 110 need not depend upon a clock signal to initiate or complete a state transition. In the present Application, the terms "command" or "status signal" can include a corresponding input or output for that command or status signal.

The power domain 120 includes a plurality of isolation cells 130, retention cells 135 and power switches 140. The APC 110 receives an "EnableAPC" command and a "Sleep" command. The "Sleep" command is received by the APC 110 to turn at least parts of the power domain 120 off (i.e., in sleep mode) or turn at least parts of the power domain 120 on (i.e., the "Sleep command is an "Awake" command). Generally, the EnableAPC command allows the APC 110 to use the "Sleep" command to determine whether to provide a power-on "PonIn" signal or a power-off "PonIn" signal, as will be described below. If the EnableAPC command is set as "Disable," the power domain 120 remains in its prior power state, regardless of the "Sleep" command.

The APC 110 provides a "RetIso" command coupled to the isolation cells 130 and the retention cells 135. When the "RetIso" command is a positive command, the isolation cells 130 isolate the retention cells 135 and any other cells in the domain from the rest of the IC in which the power domain 120 resides. If the RetIso command is a negative command, the isolation cells 130 do not isolate the retention cells 135 and any other cells in the domain from the rest of the IC. After this isolation occurs, a positive "IsoGood" status signal is provided by the isolation cells 130 to the APC 110 to denote that an isolation has occurred.

Simultaneously, the "RetIso" signal is also applied to the retention cells 135 to cause a memory retention to occur from an accessible area of the retention cell. Generally, because power is still in its on state, isolation and retention signals can be both processed simultaneously. After the retention of all the retention cells 135 occurs, then the retention cells 135 provide a positive "RetGood" status signal to be conveyed to the APC 110.

After receiving both positive "RetGood" and the "IsoGood" status signals, the APC 110 then generates a power domain off command ("PonIn"), denoting that the power switches 140 are to be turned off. The data stored in the accessible area of the retention cells has been previously stored in the retention areas of the retention cells 135, due to the previous positive "RetIso" command. Once the power is turned off to any the accessible areas of the retention cells 135 and/or non-retention cells by the power switches 140, the power switches 140 provide a negative "PGood" status signal to the APC 110.

Figure 2:
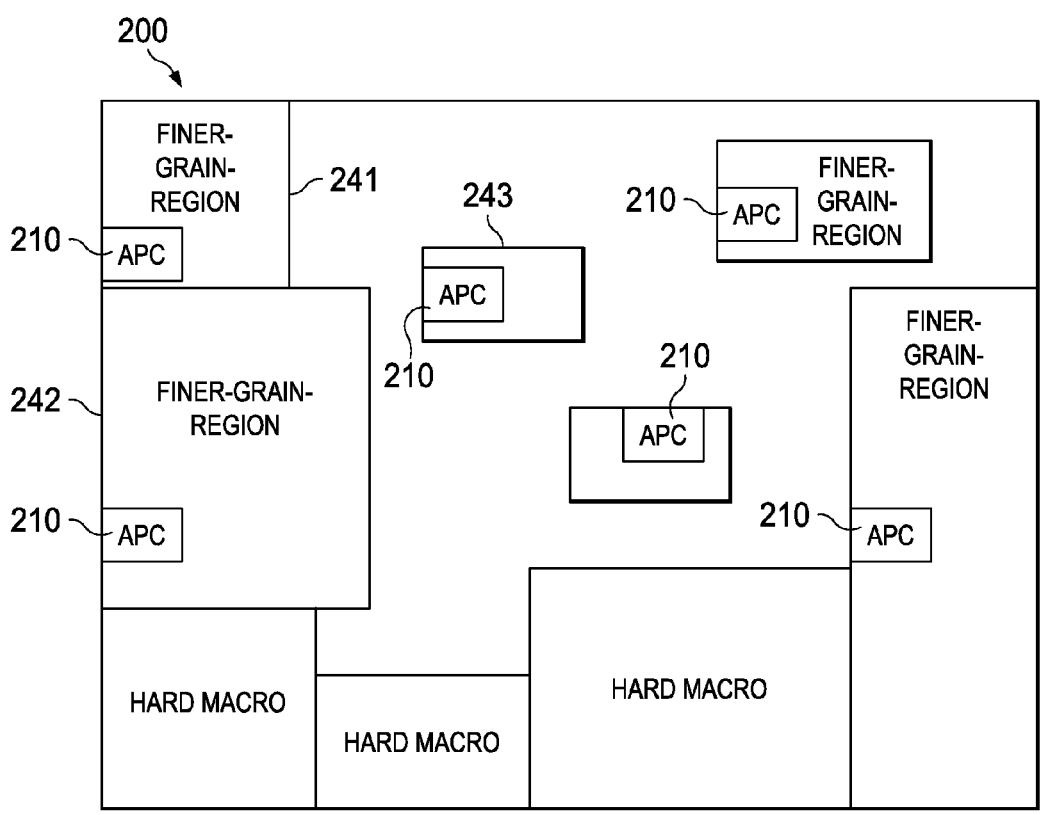
FIG. 2 is an illustration of an embodiment of an IC having a plurality of power domains, each power domain controlled by its own asynchronous power controller.

FIG. 2 illustrates an exemplary IC chip 200 including a plurality of APCs 210. Each APC 210 is associated with a different power domain 241-243. Each power domain 241-243 is capable of receiving its own "PonIn" command from its corresponding APC 210. This allows a "fine-grain" control of the IC 200 including the plurality of power domains.

Generally, because the APC 210 are asynchronous, individualized power domain control can occur without employing clock signals to power controllers, thereby avoiding some routing of clock signals across the IC 200, with its attendant problems. These problems can include use of chip "real-estate" for routing clock signals, generation of electromagnetic interference, generation of excess heat, and so on.

Figure 3:
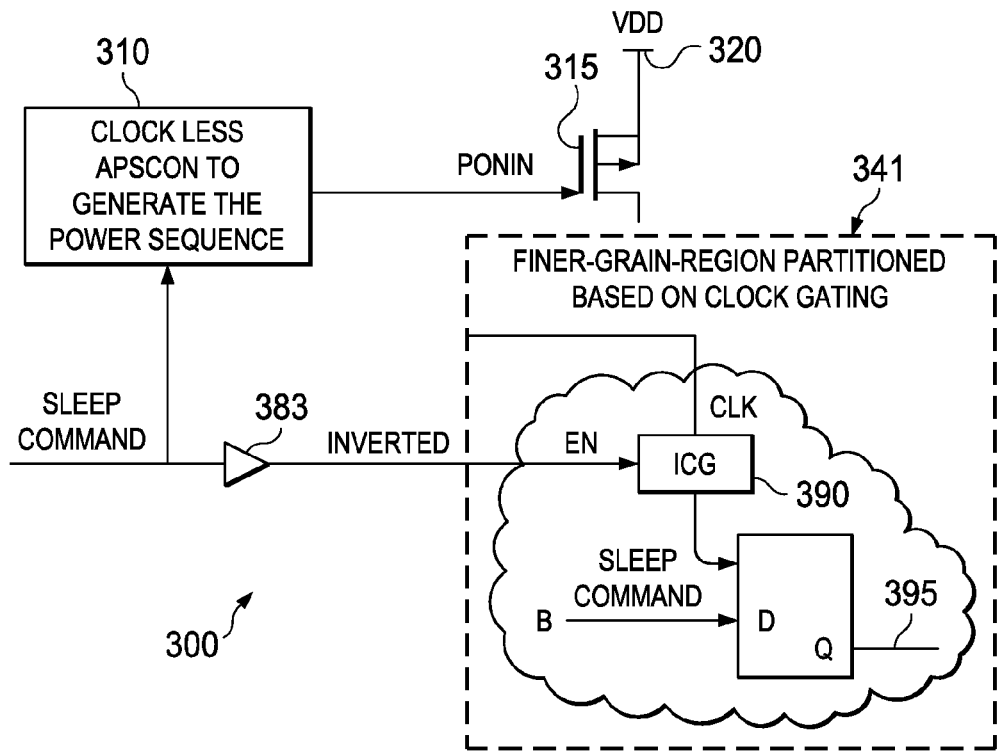
FIG. 3 is a diagram of an asynchronous power controller in an environment of controlling a single power domain.

FIG. 3 illustrates a diagram 300 of an embodiment of a reliable asynchronous power controller 310 in an environment of controlling a power domain 341. In FIG. 3, an APC 310 is coupled through a "PonIn" command output, to a power switch 315. The power switch 315 is also coupled to a VDD source 320. The power switch 315 is also coupled to the power domain 341. Therefore, with the power switch 315 is on, as commanded by the "PonIn" command, the power domain 341 receives its power from VDD 320. When the "PonIn" signal is off, at least some aspects of the power domain 341 does not receive power from VDD 320, but instead are coupled to a ground. In further or alternative embodiments, other aspects of the power domain 341 are electrically coupled to another, separate voltage source, which may be at the same voltage as VDD. As is illustrated, the APC 310 operates without receiving or providing a clock signal.

The power domain 341 is coupled both to an Enable input and a Clock signal input. This Enable signal represents whether a particular domain is to be turned-on or turned off and is an inversion of the "Sleep" command, not whether the APC 310 is itself enabled (the "EnableAPC" command, which is separate) The Enable and Clock signals are coupled to an integrated clock gating ("ICG") circuit 390. When the Enable signal is in an off state (i.e., the "Sleep" state), the ICG 390 does not convey the clock signal to a D latch 395. As a result, the D latch 395 does not provide an updated input B signal and thus saving power. However, when the Enable signal is on, the ICG 390 conveys the clocking signal to the D flip flop 395. Receiving a clocking signal at D flip flop 395 allows a signal B to be conveyed from the input to the output. Therefore, advantageously, a correlation can occur between a power domain down command to a power switch coupled to a power domain, and activity within the power domain itself, derived from the same "Sleep" command.

In the illustrated embodiment, the APC 310 is coupled to a "Sleep" input. This input drives the Ponin command. Furthermore, the "Sleep" signal is inverted by an inverter 383 and is used as the "Enable" command of the ICG 390. Again, please note that this Enable signal of FIG. 3 is different than the EnableAPC command of FIG. 1. The Enable command of FIG. 1 enables the APC 110, whereas the enable signal here is an inverted Sleep command generated by the APC 110 when the APC 110 is enabled by the EnableAPC command.

Figure 4:
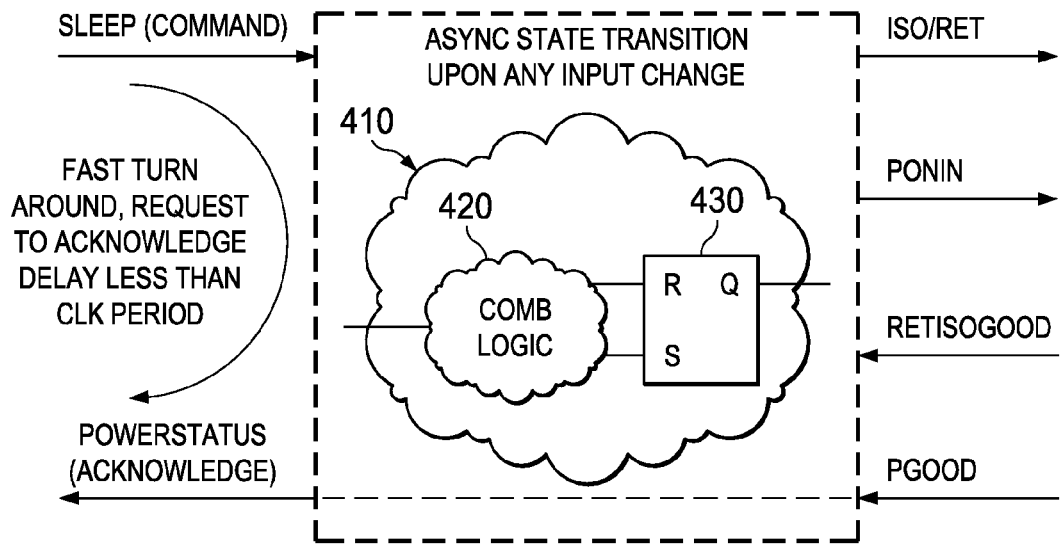
FIG. 4 is a conceptual diagram of a asynchronous power controller.

FIG. 4 illustrates a conceptual diagram of one embodiment of a reliable asynchronous power controller 410. Generally, a "Sleep" command (or its inverse, a "Wake" command) is received at the reliable APC 410 through a combinational logic, output of which is provided to an R-S flip flop 430. Please note that this is a conceptual diagram, and more explicit details will be provided in FIG. 5 with reference to illustrated state transitions of FIG. 6.

One or more R-S flip flops 430 provide the isolation and retention ("ISO/RET") commands, the "Ponin" commands, and so on. A combination logic 420 combines a "PGood" status signal, the "Sleep" command and the "RetIsoGood" command to make further determinations of signals to be provided. In some embodiments, the combination logic 420 and RS flip flop 430 use the "PGood" status signal to generate a "PowerStatus" signal to be provided to IC architecture outside of a given power domain.

Figure 5:
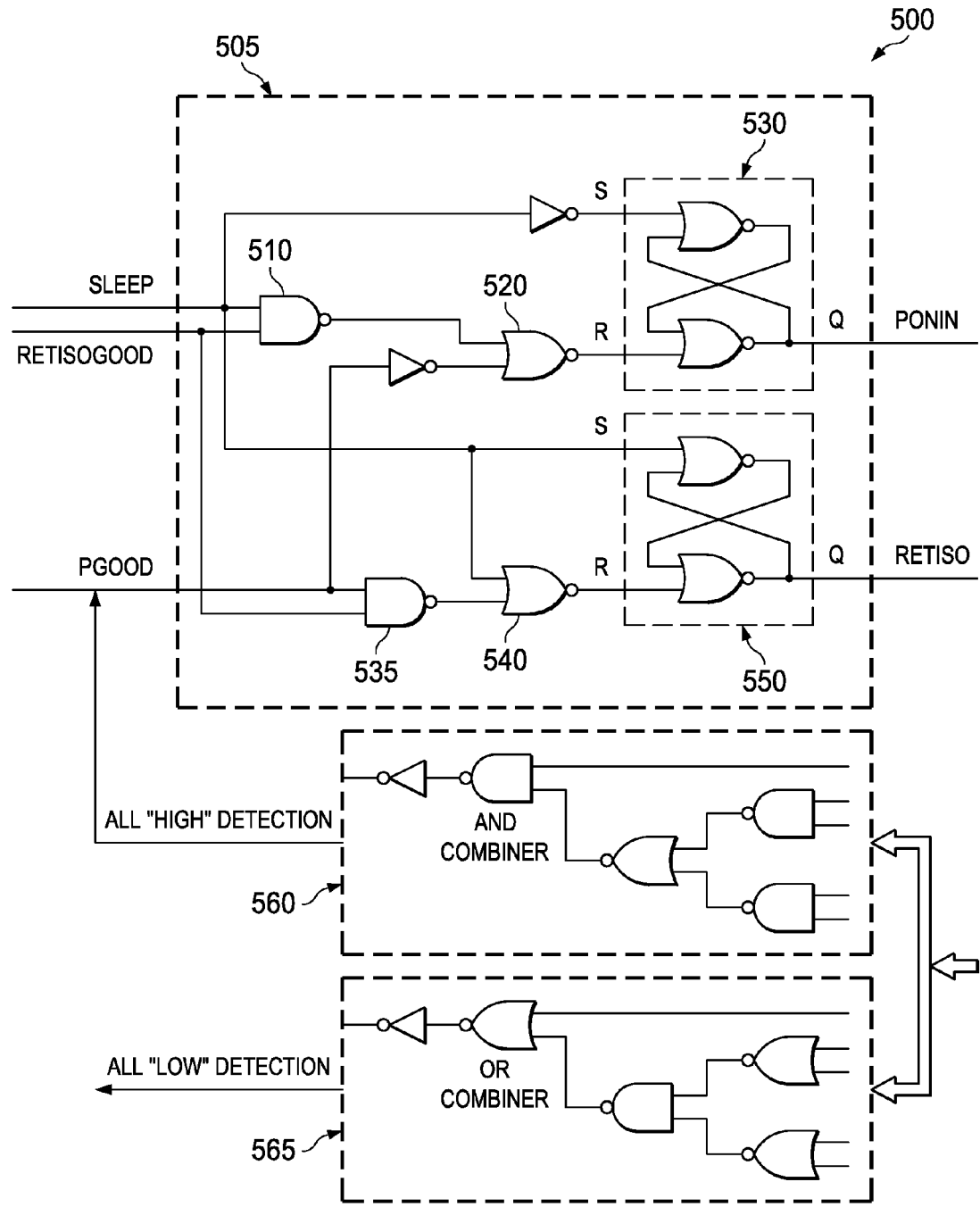
FIG. 5 illustrates an embodiment of an asynchronous reliable power controller for a power domain.

FIG. 5 illustrates one embodiment of a reliable APC 500 constructed according to the principles of the present invention. The controller 500 has a module 505. The module 505 receives a "Sleep" command (or alternatively, a "Wake" Command), a "RetIsoGood" status signal and a "PGood" status signal. The module 505 provides a "PonIn" command and a "RetIso" command. The APC 500 further includes an All High power signal combiner 560 and an All-Low power signal combiner 565. In the illustrated embodiment, the all High Power Signal combiner 560 is coupled to a PGood status signal input of the module 505.

The module 505 includes an NAND gate 510 coupled to both the "Sleep" (or "Wake") command input and the "RetIsoGood" status signal input. The module 505 further includes a NOR Gate 520 coupled to both the output of NAND gate 510 and an inverted PGood status signal input. An R-S flip-flop 530 is coupled to the output of the NOR gate 520 in its R input and an inverted "sleep" command in its S input. These inputs are then sequentially combined by the R-flip flop 530 and then provided as a "PonIn" command.

The module 540 further includes a NOR gate 540 coupled to the "Sleep" command and a combination of the "PGood" status signal and the "RetIsoGood" status signal. The "sleep" command is coupled into the S input of the RS flip-flop 550. The NAND gate 535 NANDs the "PGood" Status signal and the "RetIsoGood" status signal. An input of the NOR gate 540 is derived from an output of the NAND gate 535. An output of the NOR gate 540 is coupled to the R input of the RS flip-flop 550. These inputs are then sequentially combined by the R-flip flop 530 and then provided the "RetIso" command. Please note that in some further embodiments (not illustrated), the "Enable" command is ANDed with a provisional "Sleep" command, and this combination signal is used to generate the "Sleep" command of FIG. 5.

Figure 6:
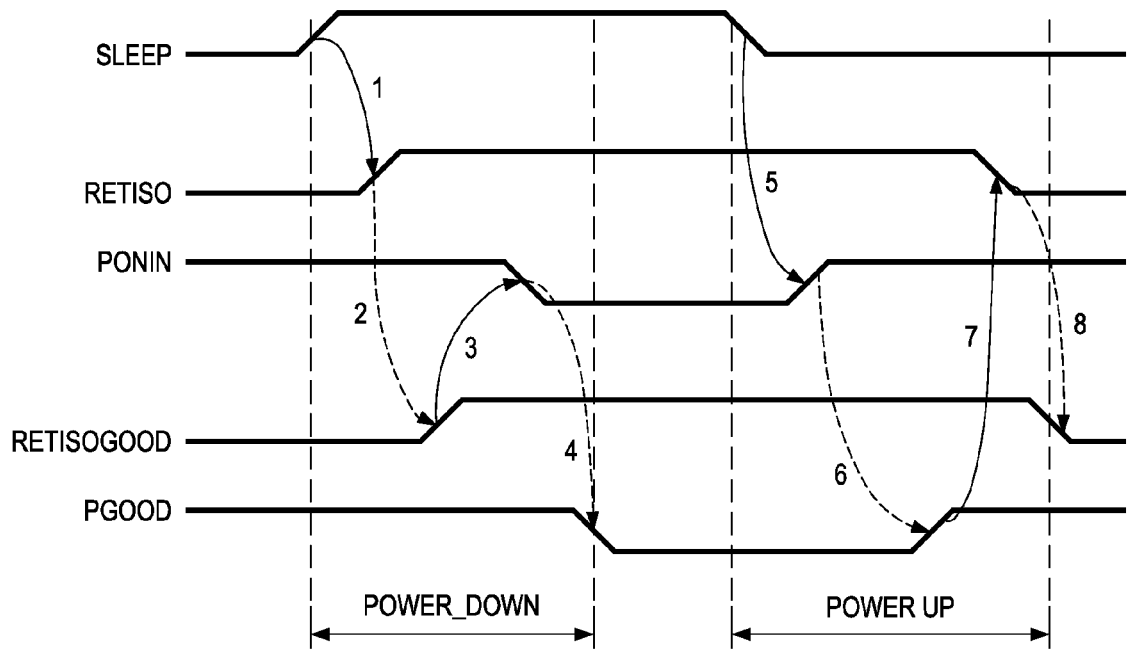
FIG. 6 illustrates an example of a timing diagram for the reliable power domain controller of FIG. 5.

With reference to FIG. 6, an operation of the APC 500 will now be described. In a full-on position, i.e., "PonIn" is on (high), the "RetIso" command is low, the "PGood" status signal is high, and the "RetIsoGood" status is low, as is illustrated in FIG. 6. Please note that "RetIsoGood" status signal can be an ANDing of the "IsoGood" status signal and "RetGood" status signal of FIG. 1.

Therefore, the output of NAND 510 is "one," so the output of NOR 520 is "zero." Therefore, the input of R into R-S flip flop ("FF") 530 is "zero." Furthermore, due to an inversion, the "Sleep" command is zero when received into the S input of the FF 530. Therefore, an output Q is a "set" command, which is a "1." Therefore, "PonIn" output value is "one," i.e., a "power domain on command."

Furthermore, in an APC 500 initial "power-high" "non-retention" state, the S input of FF 550 is a "0." The R input is a "one" due to a NOR combination of the Sleep command and a combination of the "PGood" status signal and "RetIsoGood" status signal. Therefore, "RetIso" command is "zero," i.e., "RetIso" is off.

At a beginning of a power off sequence, the APC 500 receives a "Sleep" command. The "Sleep" command goes from awaken (i.e., full working,) to Sleep. This in turn changes the input to S input to FF 530 to "zero." However, input "R" input stays at "zero" due to the NOR of the output of NAND 510. Therefore, "Ponin" command stays at the same value as previously provided, i.e., it is still at a value of "one."

The provided value conveyed into FF 550 also change. The input S into FF 550 transitions into a value of "one," and the input into "R" transitions into a "zero," from a result of "Sleep" going to 1. The FF 550 therefore generates a "RetIso" command that is positive. This transition is illustrated in FIG. 6 by state transition "1." The "RetIso" command is provided to coupled isolation and retention cells (not illustrated).

Once all the retention and isolation cells provide acknowledgment that retention and isolation has occurred, this status is conveyed to the module 505 as a positive "RetIsoGood" status signal. This transition is illustrated in FIG. 6 by state transition "2."

Once "RetIsoGood" status signal is a "one," the NAND gate 510 generates a zero, so the R input of FF 530 transitions to "one." Therefore, the "PonIn" command transitions to "zero." Therefore, coupled retention cells have a lower power provided to their retention areas. This transition is illustrated in FIG. 6 by state transition "3."

At some time in the future, the "PGood" status signal are driven low in an acknowledgment that high power is not applied to all cells in the domain. This transition is illustrated in FIG. 6 by state transition "4." The R input of the FF 530 transitions to "zero," and the "PonIn" command is in a "hold" state. In other words, "PonIn" continues to stay in a low state. Furthermore, when "PGood" status signal is "zero," the R input of the FF 550 is "zero," and the FF 550 again continues to provide a "RetIso" hold signal. The hold signal is in the affirmative retention and isolation commands.

However, during a power-on phase, sleep command goes from on (i.e., "Sleep,") to off (i.e., "Wake"). This in turn changes the S input to FF 530 to a value of "one." However, input R of FF 530 stays at "zero" due to the NOR of the output of NAND 510. Therefore, "PonIn" command transitions to affirmative. This transition is illustrated in FIG. 6 by state transition "5."

Furthermore, as a result of the "Sleep" command transitioning from a "one" to a "zero," (i.e., transitioning from a "sleep" command to an "awake" command), an input into FF 550 also transitions. The input "S" into FF 550 transitions into "zero," but the input into "R" remains a "zero." Therefore, "RetIso" command does not transition and remains in its state, that of an assertion. Instead, the APC 500 awaits reception of a positive "PGood" status signal as a result of power being successfully provided to all transition memory cells. A reception of the positive "PGood" status signal is illustrated in FIG. 6 by state transition "6."

After state transition "6," the input of FF 550 transitions from a R input with a value of "zero" and an S input with a value of "zero" to a R input value of 1 and an S input with a value of zero. Therefore, the FF 550 provides a "RetIso" command that is negative. Therefore, the negative "RetIso" command is provided to coupled isolation and retention cells. This transition is illustrated in FIG. 6 by state transition "7."

Once any of the retention and/or isolation cells provide acknowledgment that retention and isolation is no longer occurring, this information is provided to the APC 500 a negative "RetIsoGood" status signal. This transition is illustrated in FIG. 6 by state transition "8." Please note that the APC 500 is therefore ready again to receive another "Sleep" command. Please note that the APC 500 can, in some embodiments, have an off-to-on and on-to-off transition cycle "turn around speed" that is within one clock cycle of a main IC chip in which the APC 500 is situated. This is due in part to the asynchronous and combinational logic aspects of the design of the APC 500.

In some embodiments, a first combinational logic output, such as FF 530, does not transition an output state unless at least both the retention status input and the memory isolation status input are positive. In some embodiments, the memory retention status input and the memory isolation status are sequentially combined together, and a result of the combination is employed by the first and second combinational logic, wherein the sequential combination is not clocked.

Figure 7:
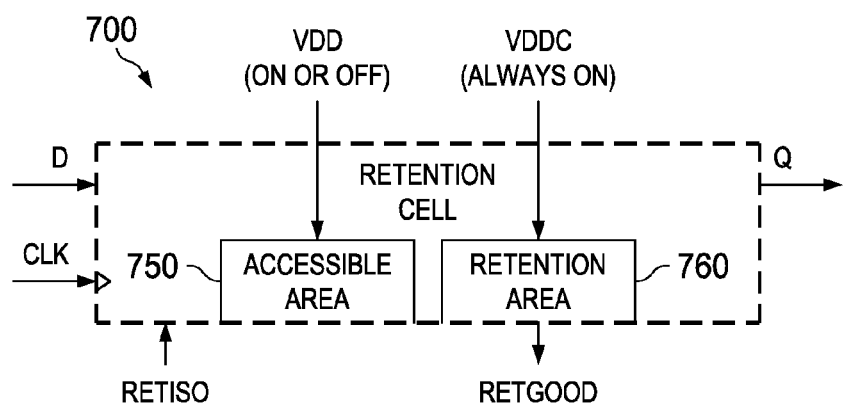
FIG. 7 illustrates one embodiment of a retention memory cell.

FIG. 7 illustrates a retention cell 800 in more detail. The retention cell 700 has a "D" (data) input and a clock input. The retention cell 700 also has a clocked "Q" output. The retention cell 800 also has a "RetIso" command input. The "RetIso" input commands the retention cell to transfer data between an accessible area 750 and a retention area 760. The accessible area is 750 electrically coupled to Vdd, and the retention area 860 is electrically coupled to Vddc.

Generally, the Vddc is "always on." In some embodiment, the Vdd voltage can be turned off or on, (e.g., grounded or not grounded) depending upon whether data has been transferred to the retention area from the accessible area, or from the retention area to the accessible area, respectively. In some alternative embodiments, the Vddc voltage is not ground, but is still lower than the Vdd.

The retention cell also provides a "RetGood" status signal. The "RetGood" status signal indicates whether a transition of memory from the accessible area 850 to the retention area 860 has occurred. The "RetGood" status signal can be used by the APC 110 in determining various state transitions.

Figure 8:
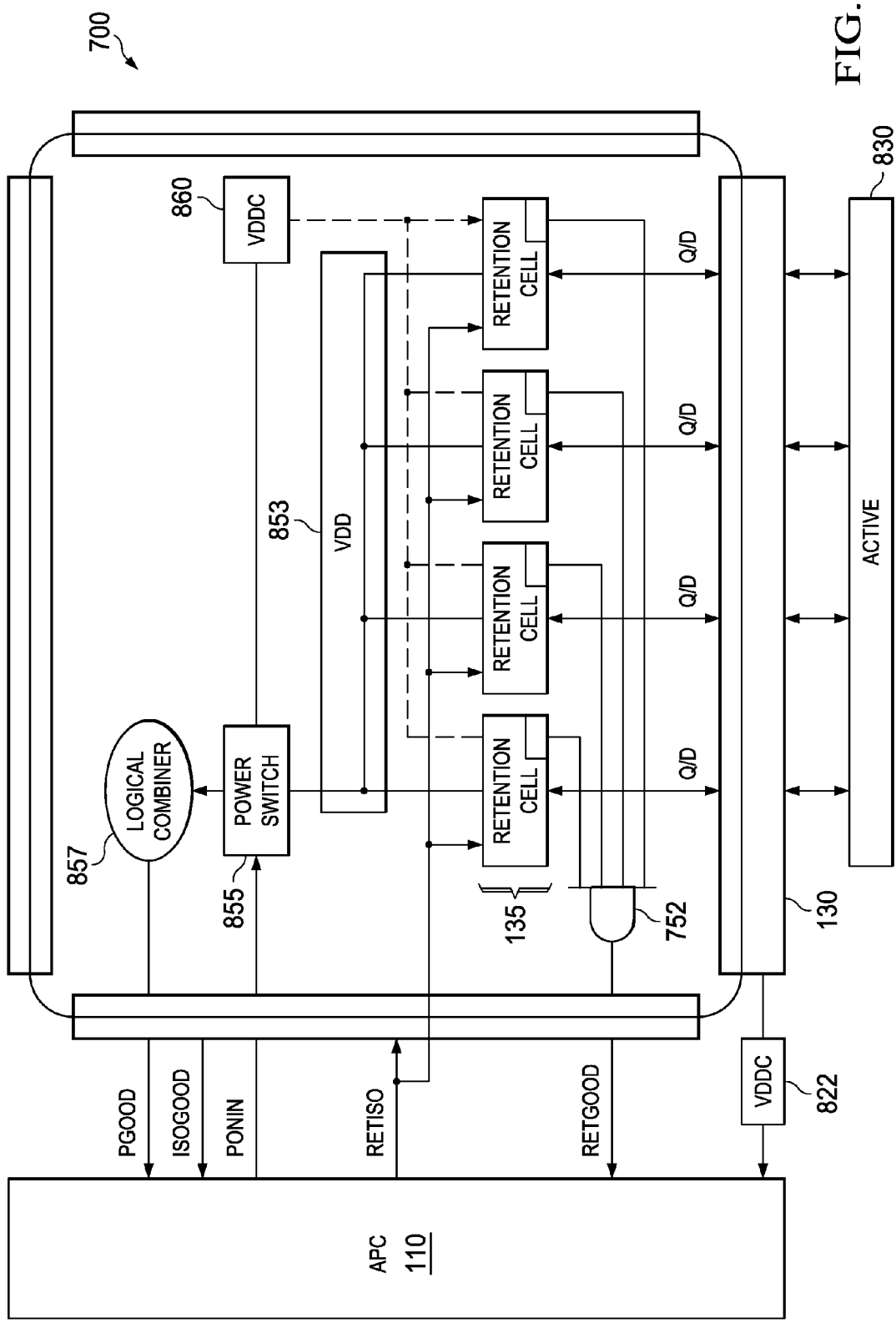
FIG. 8 illustrates an embodiment of the asynchronous power controller of FIG. 1 coupled to an array of retention memory cells of a power domain.

FIG. 8 illustrates an APC 110 coupled to a plurality of memory retention cells 135. The APC 110 is also coupled to a plurality of isolation cells 130. A retention area of the retention cells 130 receives power from a Vddc 822. An accessible area of the retention cells 135 receives power from a voltage rail Vdd 855. The output portion of the isolation cells 130 are also coupled to the voltage source 822 Vddc, which although is illustrated as a separate module for ease of illustration, is typically the same Vddc source as Vddc 860. The Vddc 822 is also coupled to and runs the APC 110.

The isolation cells 130 are also variously coupled to active areas 830. The isolation cells 130 isolate the retention cells 135 and other non-retention cells from the active area of the chip 830 when the retention cells 135 are in retention mode. The active area 830 typically belongs to a different power domain.

Vddc source voltage 860, 822 generally provides the retention power for the retention part of the retention memory cells 135 and the output portion of the isolation cells 130. Typically, this power is always on. The power switch 855 is controlled by the "Ponin" command. When the "Ponin" command is positive (i.e., a "power domain up" command), the power switch 855 couples the Vddc 860 to a voltage rail Vdd 853, and the Vddc 860 and the voltage Vdd have the same voltage potential. Therefore, the accessible areas are coupled to Vddc. However, when the Ponin is negative (i.e., a "power domain down" command), the power switch 755 couples the Vdd voltage rail to ground.

In some further embodiments, of FIG. 8, a plurality power switches 855 (not illustrated), all of which are driven by the same "Ponin" command, are coupled to a logical combiner 857, which generates a positive "PGood" status signal when all power switches are on, for a given power domain. In embodiments using a single power switch 757, this element may be eliminated, and instead an electrical characteristic of the power switch 855 can be conveyed to the APC 110 as the "PGood" status signal. The "RetGood" status signal, conveyed to the APC 110, can be a result of retention modes being positive in all the retention cells as conveyed through an AND gate 752.

In some embodiments of FIG. 8, the asynchronous power controller 110 is further configured to output a retention command and an isolation command ("RetIso") after receiving an affirmative power status signal, but before providing a power domain off command. In some further embodiments, a first APC 110 and second APC 110 and a corresponding first and second power domain are provided on an integrated circuit. (See, generally, FIG. 2) The first APC 110 can provide a first power domain off command, and the second power controller can provide a second power domain off command to a second power domain. The second power domain on command is generated from at least a second sleep command but not generated from a first sleep command. In some embodiments, the first and second power domain off commands are asserted at different times.

Figure 9:
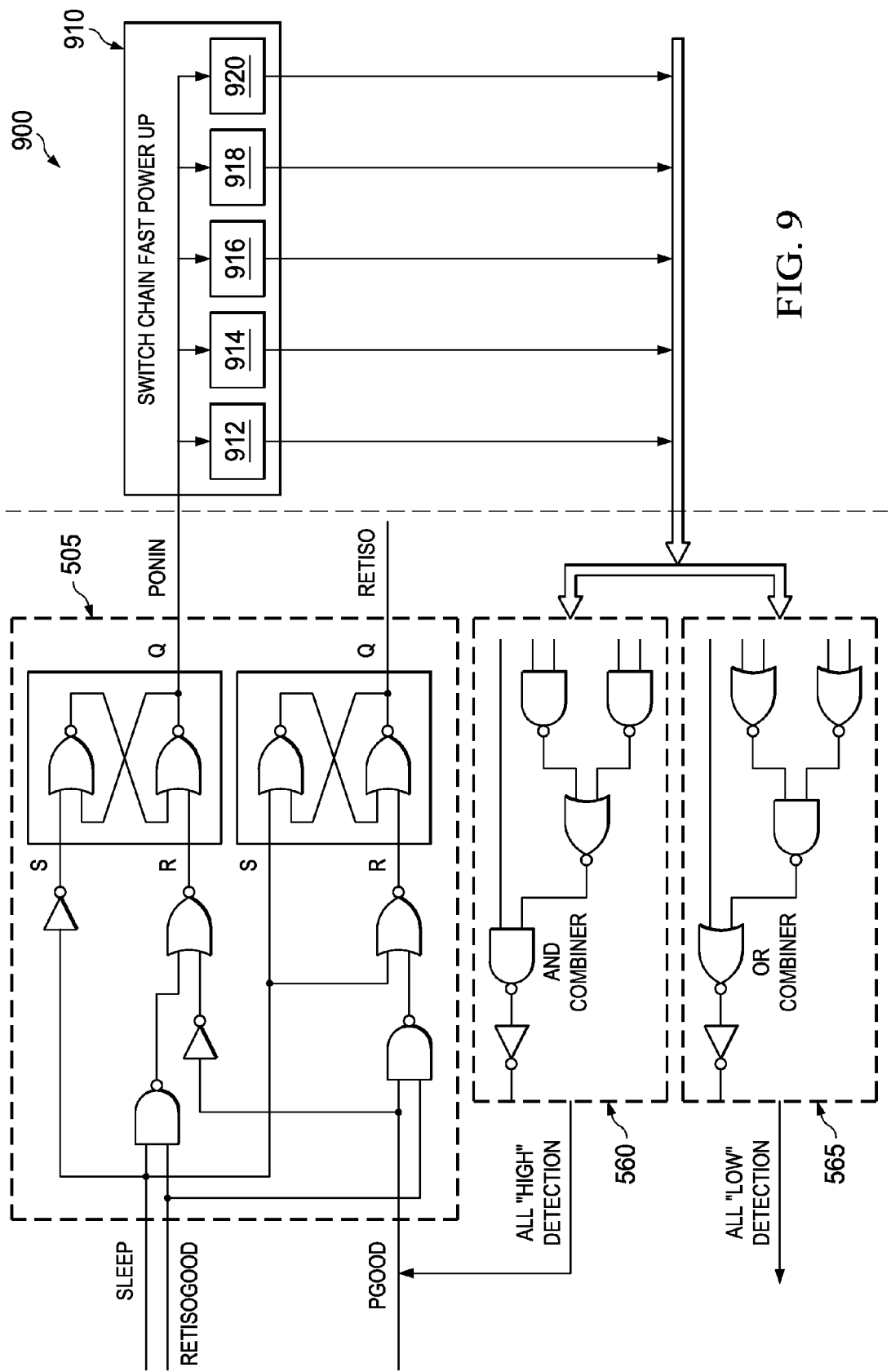
FIG. 9 illustrates an embodiment of the asynchronous power controller of FIG. 1 coupled to a plurality of power switches.

FIG. 9 illustrates an alternative embodiment of a system 900 using the module 505 for controlling a plurality of power switches 912-920 in a power domain 910. Various power switches 912-920 are coupled to a "PonIn" command input in the power domain 910. Please not that the "Isolation and Retention" command should be applied before "PonIn" is unapplied (i.e., power domain low command is applied). Also, please note that, generally speaking, before "Retention and Isolation" command is unapplied, the "PonIn" power domain on command should be applied first. The "PGood" status signal, provided to the module 505, can be generated from the power switches through a measurement of whether each given power switch is in an off state or an on state.

In a power domain 910, power status signals are applied to both an all-High detection circuit 560 and an all-Low detection circuit 565. The output of either of these circuits, or a combination of them both, can then be applied to the "PGood" status input of the module 505. 560 is shown in FIG. 9. In some embodiments, the all-Low detection circuit 565 is used at a system level.

Figure 10:
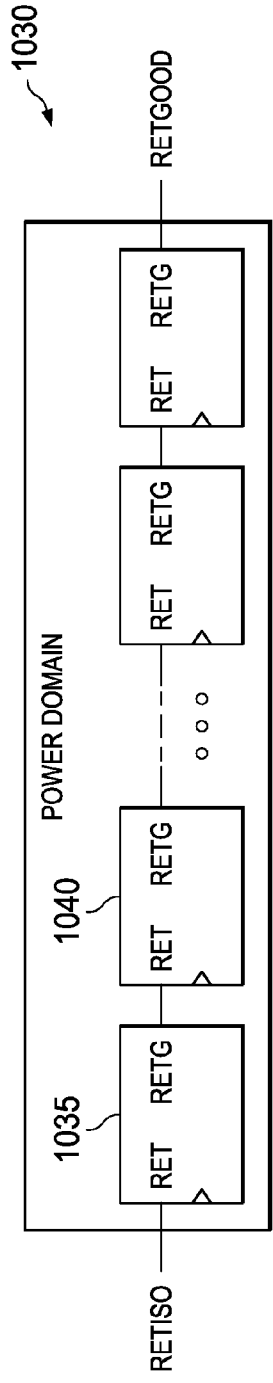
FIG. 10 illustrates a first embodiment of an array of retention cells to generate a retention status signal for employment by the asynchronous power controller of FIG. 1.

FIG. 10 illustrates an alternative embodiment for generating a "RetGood" status signal 1030, which is used in combination with the "IsoGood" status signal to produce the "RetIsoGood" status signal of FIG. 6. In the illustrated embodiment, the "RetIso" command is applied to a retention cell 1035. Then, after a retention has occurred, an acknowledgment of this is output as a "RetGood" status signal. The "RetGood status signal is itself coupled to the "Ret" input of a retention cell 1040 and acts as a "RetIso" command.

These daisy-chained retention cells are coupled together in such a fashion until the last "RetGood" status output is used as the "RetGood" status signal used by the APC 110. In some embodiments of FIG. 10, a power domain off signal occurs from a non-clocked sequential logical combination of a sleep command, the negative power status signal, the affirmative retention status signal and the affirmative isolation status signal.

Figure 11:
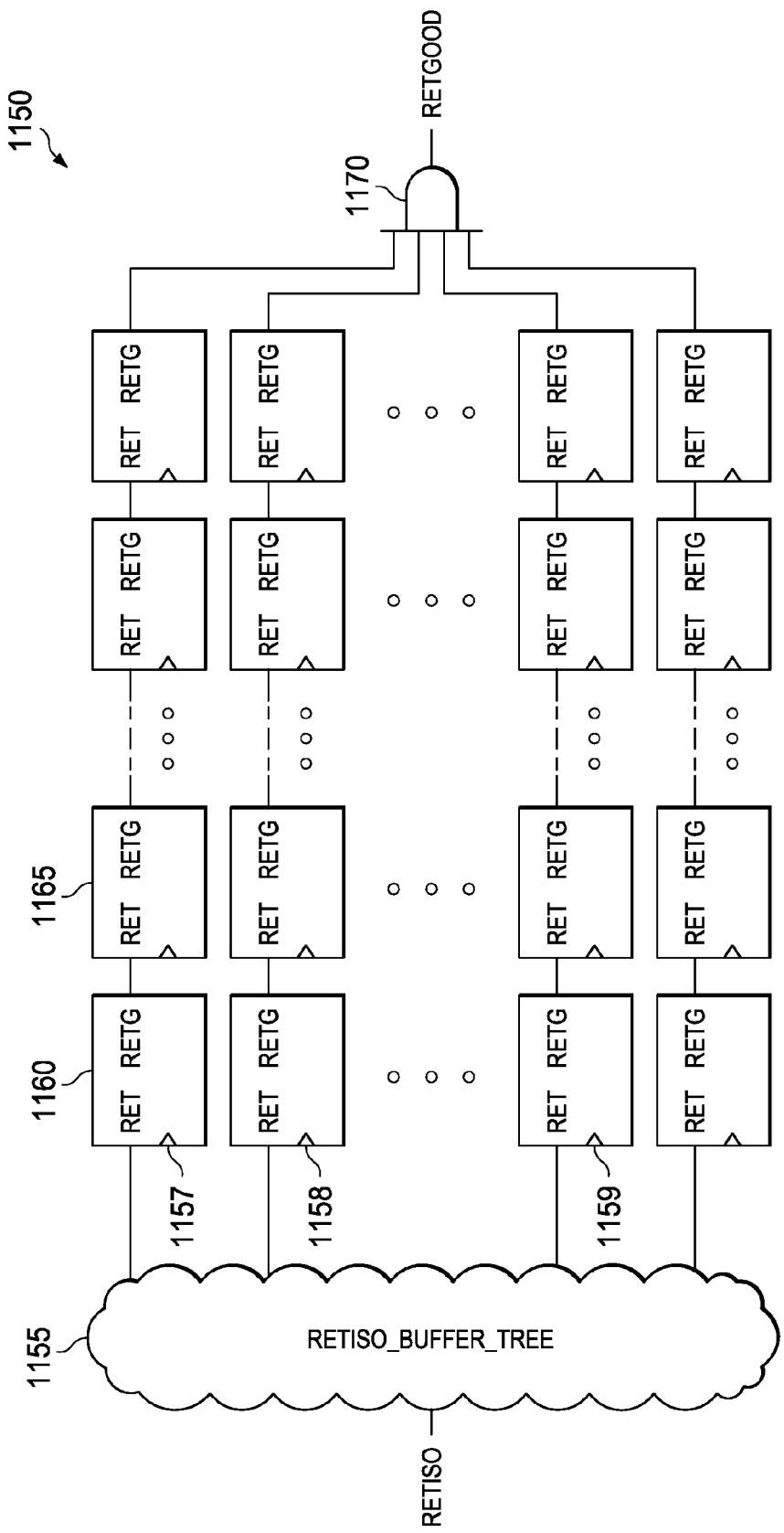
FIG. 11 illustrates a second embodiment of an array of retention cells to generate a retention status signal for employment by the asynchronous power controller of FIG. 1.

FIG. 11 illustrates a further embodiment of a daisy-chained 1150 "RetGood" status output. In FIG. 11, a RetIso command is buffered in a RetIso buffer tree 1155, to the plurality of daisy chained cells, such as retention cell 1160 and is then conveyed to coupled to retention cell 1165, and so on. Multiple chains, such as 1157, 1158, 1159, are coupled to the RetIso buffer tree 1155. The output of each chain is then ANDed at AND gate 1170, and this becomes the RetGood signal used by the APC 110.

Figure 12:
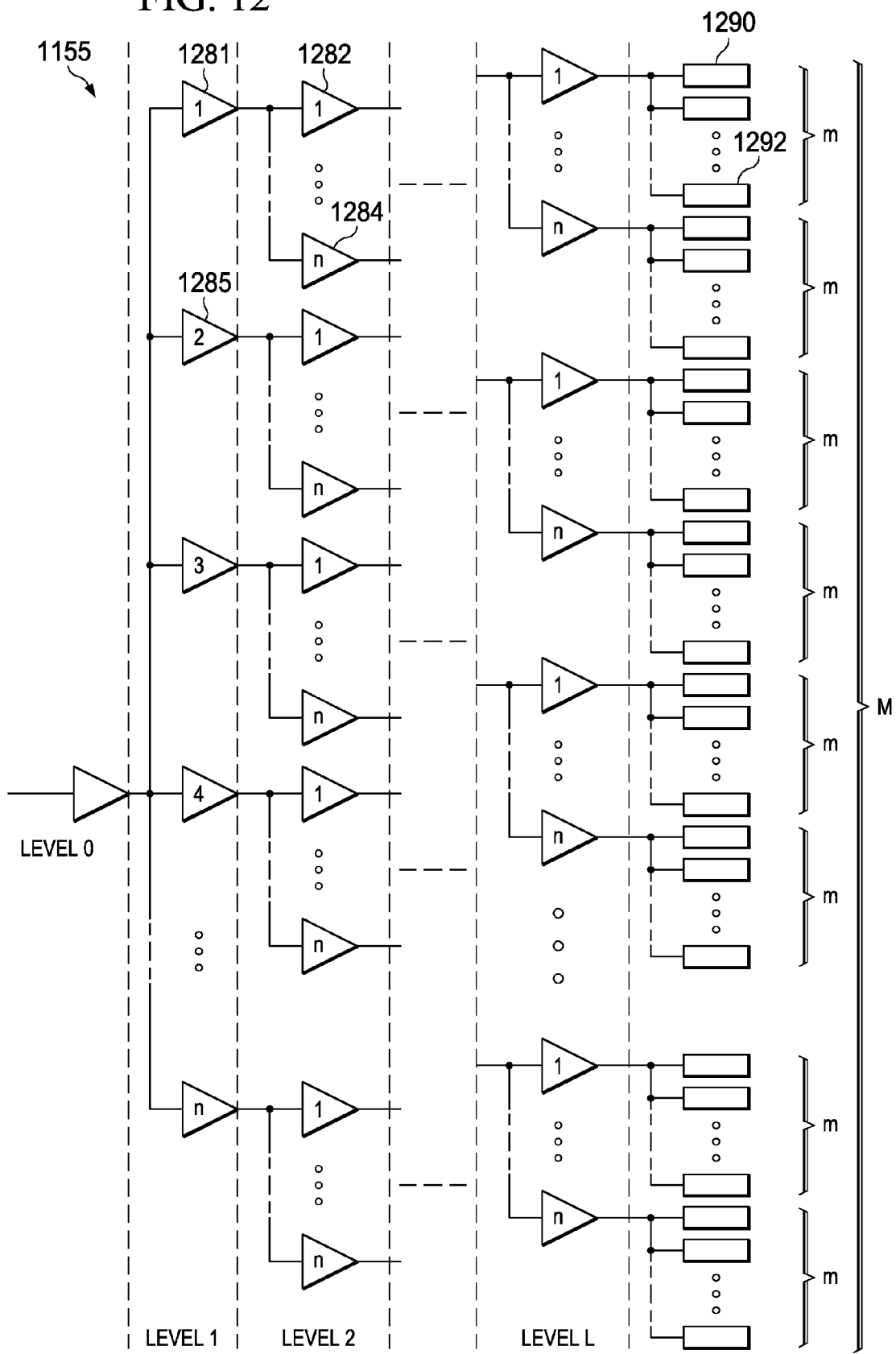
FIG. 12 illustrates an embodiment of an array of retention cells that receive a retention command from the asynchronous power controller of FIG. 1.

FIG. 12 illustrates an embodiment of the RetIso buffer tree 1155. As is illustrated, a "RetIso" command is parallel provided to a plurality of buffers 1281, 1285 and so on. Each buffer is then provided to a plurality of buffers 1282, 1284 and so on. This continues until, finally, each output of a buffer is applied to "m" retention cells, such as a first set 1290 and a second set 1292.

In some embodiments of FIG. 12, the retention command is conveyed to a plurality of retention cells through a buffer tree, the buffer tree including a hierarchy of levels of buffers, each buffer output of each buffer of a first hierarchical level coupled to two inputs of two buffers of a second hierarchical levels of buffers, wherein each buffer of a last hierarchical layer of buffers are coupled to an equal number of retention cells.

Figure 13A:
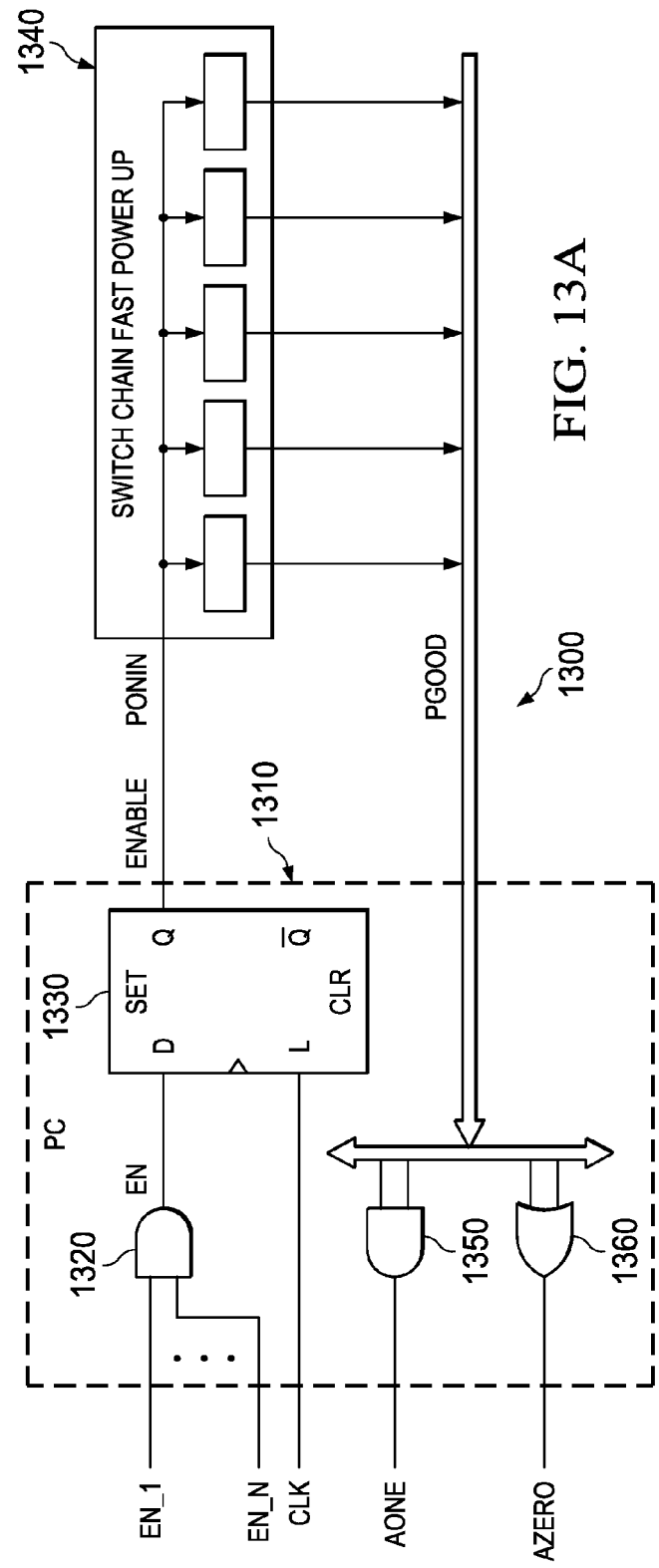
FIG. 13A illustrates an alternative embodiment of a reliable power controller for generating a power domain command.

FIG. 13A illustrates an alternative embodiment of a reliable power controller 1300. The illustrated embodiment of the PC 1300 does not provide the Isolation and Retention commands.

In the PC 1300, when generating the "PonIn" command, system level "enable" signals, such as en_1 through en_N, are employed. In the PC 1310, multiple "enable" signals are combined together in an AND gate 1320. This AND signal is provided as an "EN" signal to a D latch 1330.

A clock signal downward transition is received at an L input of the D latch 1330. On the downward transition of the clock cycle, the latch 1330 latches the EN state. The D flip flop 1330 generates the EN signal as a clocked ENABLE signal to the power switches 1340 when the clock is low. The ENABLE commands sets an off or on and power state for various power domains, such as retention cells.

The power state of the switches 1340 is then conveyed to the AND gate 1350 and provided as the status signal AOne, and the OR gate 1360 and provided as the AZero. These signals are then employed at a system level to help fault detection. Then, at a later time, the clock signal transitions up, and the reliable power controller 1300 awaits a next downward clock transition to again output a reliable ENABLE command. Also, advantageously, as will be described below regarding method 1500, a power-on to power-off and power-off to power-on transition can take less than one clock cycle.

Figure 13B:
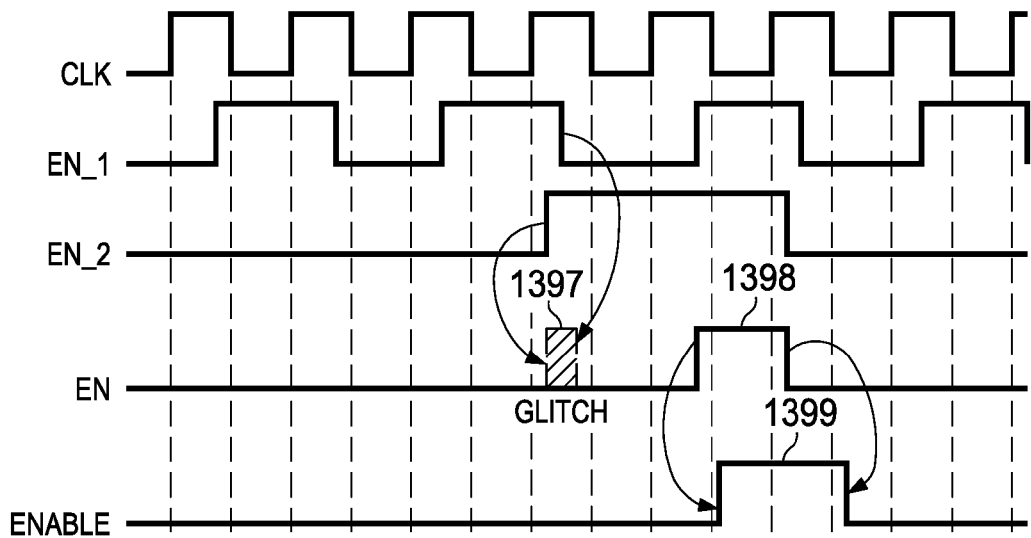
FIG. 13B illustrates a timing diagram for the reliable power controller of FIG. 13A.

FIG. 13B illustrates a timing diagram of the PC 1300. As is illustrated, a clock signal is received, as well as an EN_1 signal and an EN_2 signal. An error, or "glitch" 1397 in the EN line is internally generated due to the ANDing of these Enable values. However, advantageously, this glitch is not conveyed as an ENABLE signal, as it has dissipated before a next clock transition signal. Therefore, only a reliable (i.e., substantially glitch-free) EN command 1398 is then transitioned as the ENABLE command 1399.

These generates, which are then conveyed as "PGood" status signals, are then combined in an AND gate 1350 as an AOne status signal, and an OR gate 1360 as an AZero status signal. These signals are used by the environment for fault detection.

FIG. 14A illustrates a method of generating a power off sequence of the asynchronous controller of 1, such as illustrated in transitions 1 through 4 of FIG. 6.

After a start of method 1400, it is determined whether the EnableAPC command is positive in step 1405. If "EnableAPC is not positive, the APC 110 is not enabled, so the power domain continues in its present power state in step 1412. However, if the EnableAPC is on, in a step 1410, the APC 110 receives a "Sleep" command.

In a step 1420 the APC 110 provides a retention and isolation command. In a step 1430, the APC 110 determines whether it has received both a positive retention status signal and a positive isolation status signal. If not, the APC 110 continues to wait.

However, if the APC 110 has received both the retention and isolation status signals, a power domain off command is issued in a step 1440. Then, in a step 1450, a power domain off good status signal is received by the APC 1450.

In some embodiments of the method 1400, upon receiving the sleep command, an affirmative power status signal is also received, denoting that a power is being applied to the power domain. In some embodiments of the method 1400, a positive retention command and an isolation command is provided after receiving the affirmative power status signal, but before providing the power domain off command. In some embodiments of the method 1400, a positive retention command denotes that memory information is to be moved from an accessible memory area to a retention area of the power domain. In some embodiments, the method 1400 does not provide the power domain off command if the sleep command, an affirmative power status signal, an affirmative retention status signal and an affirmative isolation status signal are not all received.

In some embodiments of the method 1400, a lower power is applied to a memory of the power domain as a result of a reception of the power domain off command by the power domain than if the power domain off command is not received by the domain area. In some embodiments, a power domain off status signal is conveyed from the power domain after the power domain has powered off as a result of receiving the power domain off command.

In some embodiments, providing the power domain off command results from a non-clocked sequential logic combination of at least the sleep command, an affirmative retention status signal and an affirmative isolation status signal. Some embodiments further include receiving an enable command before receiving the sleep command.

In some embodiments, the sleep command is a first sleep command, further including applying a second power domain off command to a second power domain, the second power domain off command generated from at least a second sleep command but not from the first sleep command, and wherein the first and second power domain off command are asserted at different times.

Figure 14B:
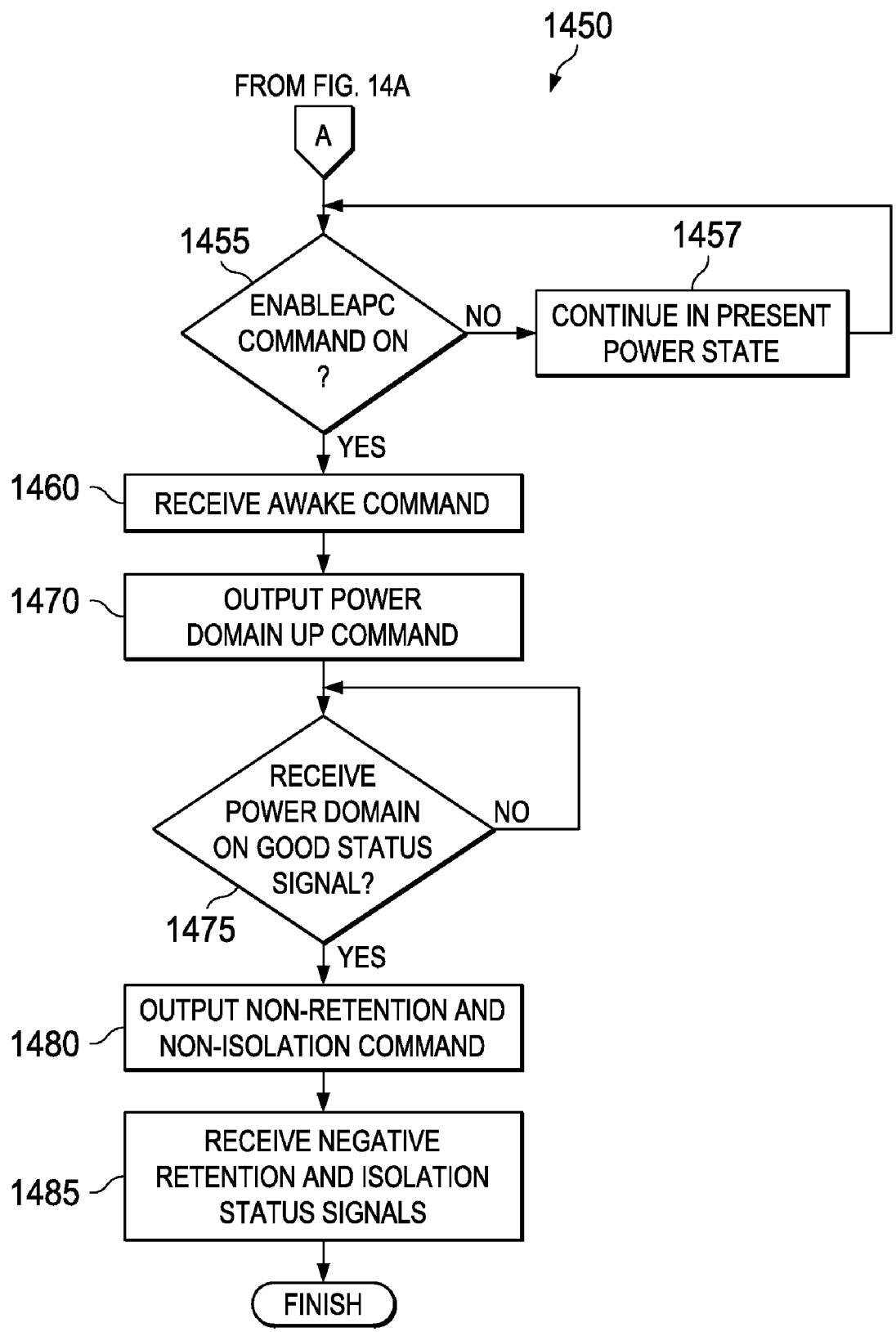
FIG. 14B illustrates a method of generating a power domain on sequence of the asynchronous controllers of FIG. 1.

FIG. 14B, illustrates a method 1450 for generating a power-on sequence of the asynchronous controllers of FIG. 1, such as illustrated in transitions 55 through 8 of FIG. 6.

After a start, it is determined whether the EnableAPC command is on in step 1455. If enable is not on, the APC 110 is not enabled, so the power domain continues in its present power state in step 1457. However, if the EnableAPC command is positive, in a step 1460, the AC 110 receives an "awake" command. The "awake" command is an opposite of a "sleep" command. In a step 1470 the APC 110 provides a power domain on command. In a step 1475, the APC 110 determines whether it has received a power domain on good status signal. If not, the APC 110 continues to wait.

However, if the APC 110 has received the power domain on good status signal, a non-retention and non-isolation command is provided in a step 1480. Then, in a step 1485, a negative retention and isolation status signal is received by the APC 110.

In some embodiments of the method 1450, a negative power status signal is received denoting that a power is not being applied to the power domain upon receiving the awaken command. In some embodiments, a power domain on command is provided to the power domain upon receiving the awaken command, a negative power status signal, an affirmative retention status signal and an affirmative isolation status signal. In some embodiments, a negative retention status signal is received after providing a non-retention command and a non-isolation command.

In some embodiments of the method 1450, a provision of the power domain on signal occurs from a non-clocked sequential logical combination of the awaken command, the negative power status signal, an affirmative retention status signal and an affirmative isolation status signal. In some embodiments, a second power domain on command is applied to a power domain, the second power domain on signal generated from at least a second negative sleep signal, but not from a first negative sleep signal, wherein the first and second power domain on signals are asserted at different times. In some embodiments, the method further includes receiving, upon receiving the awaken signal, an affirmative retention status signal denoting that, in the power domain, a retention area has stored data.

Figure 15:
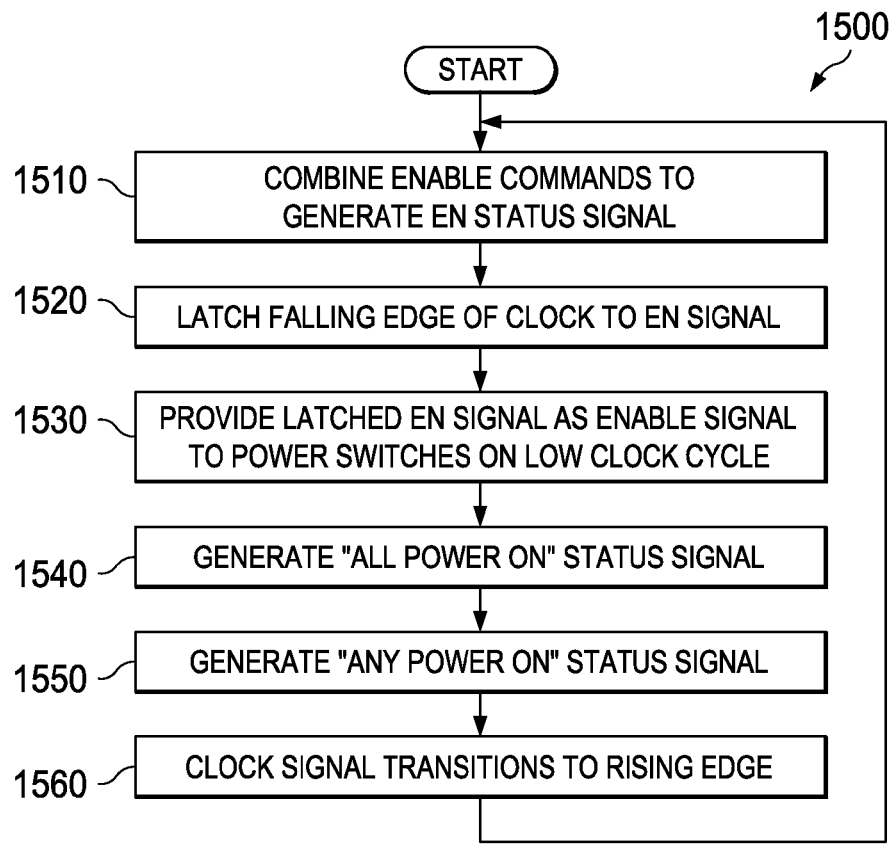
FIG. 15 illustrates a method of generating a power off and power on sequence of the power controller of FIG. 13A.

FIG. 15 illustrates a method of use of the reliable power controller 1300 of FIG. 13. In a step 1510, the reliable power controller combines a plurality of enable commands to generate an unclocked enable status signal ("EN"). Please note that the EN status signal is not the EnableAPC status command of FIG. 1. In the illustrated embodiment, the combination of the plurality of enable signals is an AND sequential combination.

In a step 1520, the controller 1300 latches, on an edge of a clock signal, the EN signal. In the illustrated embodiment, the latch occurs on the falling edge, but in other embodiments, the latch can be on a rising edge of the clock signal.

In a step 1530, a latched EN signal is provided as an ENABLE signal to one or more power switches. In the illustrated embodiment, the provision of the ENABLE initially occurs on a low reference of a clock pulse (i.e., the bottom of the clock pulse), but in other embodiments, the provision of the ENABLE initially occurs on a high reference of a clock pulse (i.e., the high of the clock pulse).

In a step 1540, an "All Power On" status signal is generated. This status signal conveys whether all power switches are on or not. If a step 1550, an "Any Power On" status signal is generated. This status signal conveys whether any power switches are on or not. In a step 1560, the clock signal transitions to an opposite clock edge to the initial edge, such as a rising clock edge, although in other embodiments, an opposite clock edge can be a falling clock edge.

Those skilled in the art to which the invention relates will appreciate that other and further additions, deletions, substitutions and modifications may be made to the described embodiments without departing from the scope of the invention.

What is claimed is:

1. A method of asynchronously reducing power of a power domain, comprising:
   receiving a sleep command for said power domain;
   receiving, upon receiving said sleep command, an affirmative retention status signal denoting that a retention area in said power domain has stored data;
   receiving, upon receiving said sleep command, an affirmative isolation status signal that denotes that an isolation of said power domain has occurred;
   receiving, upon receiving said sleep command, an affirmative power status signal, denoting that a power is being applied to all of said power domain; and
   providing a power domain off command to said power domain upon receiving at least said sleep command, said affirmative status retention signal, said affirmative power status signal and said affirmative status isolation signal;
   wherein the method does not output said power domain off command when said sleep command, said affirmative power status signal, said affirmative retention status signal and said affirmative isolation status signal are not all received.

2. The method as recited in claim 1 further comprising providing an affirmative retention command and isolation command after receiving said affirmative power status signal, but before providing said power domain off command.

3. The method as recited in claim 2 wherein said retention command denotes that memory information is to be moved from an accessible area to a retention area of a retention cell of said power domain.

4. The method as recited in claim 1 wherein a ground is applied to at least part of a retention cell of said power domain as a result of a reception of said power domain off command.

5. The method as recited in claim 1 further comprising a power domain off good signal conveyed from said power domain after at least part of said power domain of said memory area has powered off as a result of receiving said power domain off command at said power domain.

6. The method as recited in claim 1 wherein said providing said power domain off command occurs from a non-clocked sequential logic combination of at least said sleep command, said affirmative retention status signal, said affirmative power status signal and said affirmative isolation status signal.

7. The method as recited in claim 1 further comprising receiving a separate power controller enable command before receiving said sleep command.

8. The method as recited in claim 1 wherein said sleep command is a first sleep command and further comprising applying a second power domain off command to a second power domain, said second power domain off signal generated from at least a second sleep command but not from said first sleep command, and wherein said first and second power domain off command are asserted at different times.

* * * * *